United States Patent
Dill, III

(10) Patent No.: US 10,498,085 B2
(45) Date of Patent: Dec. 3, 2019

(54) MOLDED INTERCONNECT SUBSTRATE FOR A CABLE ASSEMBLY

(71) Applicant: TE CONNECTIVITY CORPORATION, Berwyn, PA (US)

(72) Inventor: Gustaf Emil Dill, III, Mechanicsburg, PA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 15/909,367

(22) Filed: Mar. 1, 2018

(65) Prior Publication Data

US 2019/0273342 A1 Sep. 5, 2019

(51) Int. Cl.

| H01R 4/66 | (2006.01) |
| H01R 13/6463 | (2011.01) |
| H01R 13/629 | (2006.01) |
| H01B 11/06 | (2006.01) |
| H05K 3/40 | (2006.01) |

(52) U.S. Cl.
CPC ......... *H01R 13/6463* (2013.01); *H01B 11/06* (2013.01); *H01R 13/629* (2013.01); *H05K 3/403* (2013.01); *H05K 2201/09118* (2013.01)

(58) Field of Classification Search
CPC .. H01R 13/6463; H01R 13/629; H05K 3/403; H05K 2201/09118; H01B 11/06
USPC ............. 439/607.41, 607.46, 98, 99
See application file for complete search history.

(56) References Cited

U.S. PATENT DOCUMENTS

| 7,155,815 | B2 | 1/2007 | Gernhardt et al. |
| 7,670,154 | B2* | 3/2010 | Yu ............. H01R 4/184 |
| | | | 439/579 |
| 8,393,918 | B2 | 3/2013 | Cheng et al. |
| 9,039,453 | B2 | 5/2015 | Song |
| 9,466,925 | B2 | 10/2016 | Rost et al. |
| 9,590,353 | B2 | 3/2017 | Regnier et al. |
| 2009/0197467 | A1* | 8/2009 | Ko ............. H01R 9/034 |
| | | | 439/607.28 |
| 2010/0081302 | A1* | 4/2010 | Atkinson ....... H01R 13/6474 |
| | | | 439/98 |
| 2013/0196555 | A1* | 8/2013 | Scherer ........ H01R 13/6463 |
| | | | 439/686 |
| 2015/0044907 | A1* | 2/2015 | Kuang .......... H01R 9/038 |
| | | | 439/607.22 |

(Continued)

OTHER PUBLICATIONS

N. Heininger, "3D LDS Components for New Production Opportunities", Microwave Journal, Feb. 14, 2012, pp. 1-5.

*Primary Examiner* — Abdullah A Riyami
*Assistant Examiner* — Nelson R. Burgos-Guntin

(57) ABSTRACT

An electrical device includes a molded interconnect substrate having a top surface and a bottom surface, the substrate having a mold component and a laser direct structuring component. A conductive circuit is formed along the top surface having one or more signal contacts and one or more ground contacts. The electrical device includes a communication cable having a differential pair of signal conductors and a grounding element. The communication cable has a cable jacket surrounding the signal conductors and the grounding element. Each signal conductor has a wire-terminating end that is coupled to a corresponding signal contact, the wire-terminating end projecting beyond a jacket edge of the cable jacket.

21 Claims, 2 Drawing Sheets

(56) References Cited

U.S. PATENT DOCUMENTS

| | | | |
|---|---|---|---|
| 2015/0111402 A1* | 4/2015 | Hackman | H01R 13/648 439/98 |
| 2016/0049746 A1* | 2/2016 | Gross | H01R 13/5208 439/660 |
| 2016/0079714 A1* | 3/2016 | Wu | H01R 13/6585 439/607.05 |

* cited by examiner

MOLDED INTERCONNECT SUBSTRATE FOR A CABLE ASSEMBLY

BACKGROUND OF THE INVENTION

The subject matter herein relates generally to a molded interconnect substrate for a cable assembly having one or more communication cables that are terminated to the molded interconnect substrate.

Communication cables electrically couple to various types of electrical devices to transmit signals, such as connectors and substrates. For example, at least some known communication cables include a differential pair of signal conductors surrounded by a shield layer that, in turn, is surrounded by insulation and a cable jacket. The shield layer includes a conductive foil, which functions to shield the signal conductor(s) from electromagnetic interference (EMI) and generally improve performance. At an end of the communication cable, the cable jacket, the shield layer, and insulation that covers the signal conductor(s) may be removed or stripped to expose the signal conductor(s). The exposed portions of the conductor(s) may then be mechanically and electrically coupled, such as soldered, to corresponding elements of an electrical device. Some communication cables also include a grounding element, such as the shield layer or a drain wire (also referred to as a grounding wire), that extends alongside the signal conductors for the length of the communication cable and mechanically and electrically couple to corresponding elements of the electrical device.

Typically, the substrate for a cable assembly includes a printed circuit board (PCB). Conventional methods of manufacturing a PCB are limited by manufacturing tolerances, which limits the accuracy and/or precision of positioning various features and/or components on the substrate. For example, manufacturing a printed circuit board (PCB) is generally limited by manufacturing tolerances of about +/−0.1 mm. A PCB may include positioning elements, such as detents, tabs, or grooves, which can be engaged for handling of the PCB and positioning of additional components on the PCB during automated assembly of the cable assembly. At least in part, the manufacturing tolerance of the positioning elements determine the accuracy and/or precision of component location and assembly of the cable assembly. In addition, assembly of the cable assembly may require additional components and processes to terminate the communication cables to the substrate. For example, the electrical device may include a busbar, lead frame, housing, and the like, to terminate the communication cables to the substrate using various processes, such as soldering, adhesives, welding, and the like. Today's cable assemblies call for greater accuracy and precision, reliability, reduction in components, and ease in manufacturing and assembly.

Accordingly, there is a need for an electrical device that provides for easy, accurate, precise, and reliable manufacture of a communication cable assembly.

BRIEF DESCRIPTION OF THE INVENTION

In one embodiment, an electrical device is provided that includes a molded interconnect substrate having a top surface and a bottom surface. The substrate has a mold component and a laser direct structuring component. An conductive circuit is formed along the top surface. The conductive circuit has one or more signal contacts and one or more ground contacts. The electrical device includes a communication cable having a differential pair of signal conductors and a grounding element. The communication cable has a cable jacket surrounding the signal conductors and the grounding element. Each signal conductor has a wire-terminating end that is coupled to a corresponding signal contact, the wire-terminating end projecting beyond a jacket edge of the cable jacket.

In another embodiment, an electrical device is provided that includes a molded interconnect substrate having a top surface. The molded interconnect substrate is formed from a mold component and a laser direct structuring component. An conductive circuit is formed along the top surface. The conductive circuit has one or more signal contacts and one or more ground contacts configured to electrically and mechanically couple with one or more communication cables. An alignment element is positioned along the top surface of the molded interconnect substrate and configured for alignment of one or more communication cables with the corresponding one or more signal contacts and one or more ground contacts of the conductive circuit.

In yet another embodiment, a cable assembly is provided that includes a molded interconnect substrate having a top surface. A conductive circuit is established along the top surface via laser direct structuring technology. The conductive circuit has one or more signal contacts and one or more ground contacts. The cable assembly includes a communication cable having a differential pair of signal conductors and a grounding element providing electrical shielding for the signal conductors. The communication cable has a cable jacket surrounding the signal conductors and the grounding element. Each signal conductor has a wire-terminating end that is coupled to a corresponding signal contact, the wire-terminating end projecting beyond a jacket edge of the cable jacket. An alignment element is positioned along the top surface of the molded interconnect substrate and configured to align the signal conductors and grounding element of the communication cable with corresponding signal contacts and ground contacts of the conductive circuit.

DETAILED DESCRIPTION OF THE INVENTION

Embodiments described herein include electrical devices, such as, electrical connectors, circuit board assemblies, and the like, that have a molded interconnect substrate and differential pairs of signal conductors and a grounding element terminated to the substrate. The molded interconnect substrate may include a conductive circuit established via laser direct structuring technology. For example, embodiments may include signal contacts and ground contacts operatively connected by circuit traces. The molded interconnect substrate may also include alignment elements configured to align the communication cables with corresponding signal contacts and ground contacts of the conductive circuit. The molded interconnect substrate may have a variety of configurations as set forth herein.

Figure 1:
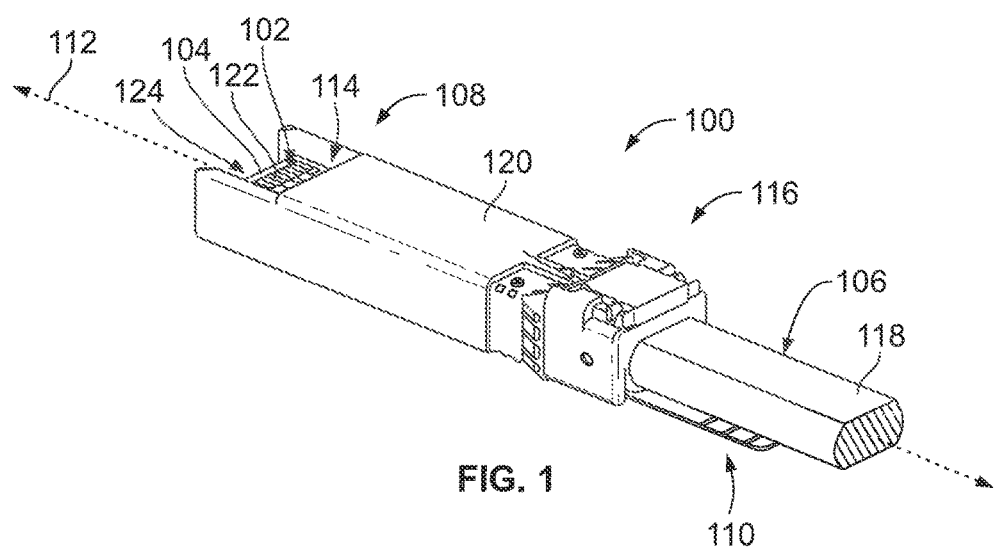
FIG. 1 is a perspective view of an exemplary electrical device formed in accordance with an embodiment.

FIG. 1 is a perspective view of an electrical device 100 formed in accordance with one embodiment that includes a connector assembly 102 having a substrate 104 and a communication cable 106 having one or more differential pairs of signal conductors and a grounding element (not shown). In the illustrated embodiment, the electrical device 100 is an electrical connector, such as a small form-factor pluggable (SFP) transceiver. However, the electrical device 100 may be another type of electrical connector in an alternative embodiment. For example, the electrical device 100 may be any device that includes a substrate having differential pairs of signal conductors and a grounding element terminated thereto.

As shown in FIG. 1, the electrical device 100 has a mating end 108, a loading end 110, and a central axis 112 extending therebetween. The electrical device 100 may include a plug portion 114 at the mating end 108 and a cable portion 116 at the loading end 110. The plug portion 114 is configured to be inserted into a receptacle (not shown) of a communication system (not shown). The cable portion 116 is configured to couple to the communication cable 106 which has an insulative jacket 118. The insulative jacket 118 may surround the one or more differential pairs of signal conductors. The insulative jacket 118 may comprise a number of layers that surround the differential pairs for shielding the differential pairs and providing strain resistance for the communication cables. The layers may include, for example, polyvinyl chloride (PVC), copper braid, and/or tape.

The electrical device 100 includes a device housing 120 that has a housing cavity (not shown) configured to hold a portion of the connector assembly 102. The connector assembly 102 includes the substrate 104, which has electrical contacts 122 located at a mating edge 124 of the substrate 104, which is proximate to the mating end 108 of the electrical device 100. In an exemplary embodiment, the mating edge 124 is configured to mate with an electrical connector (not shown) of the receptacle and establish a communicative connection through the electrical contacts 122. The electrical contacts 122 may be communicatively coupled to the differential pairs of the signal conductors and the grounding element.

Figure 2:
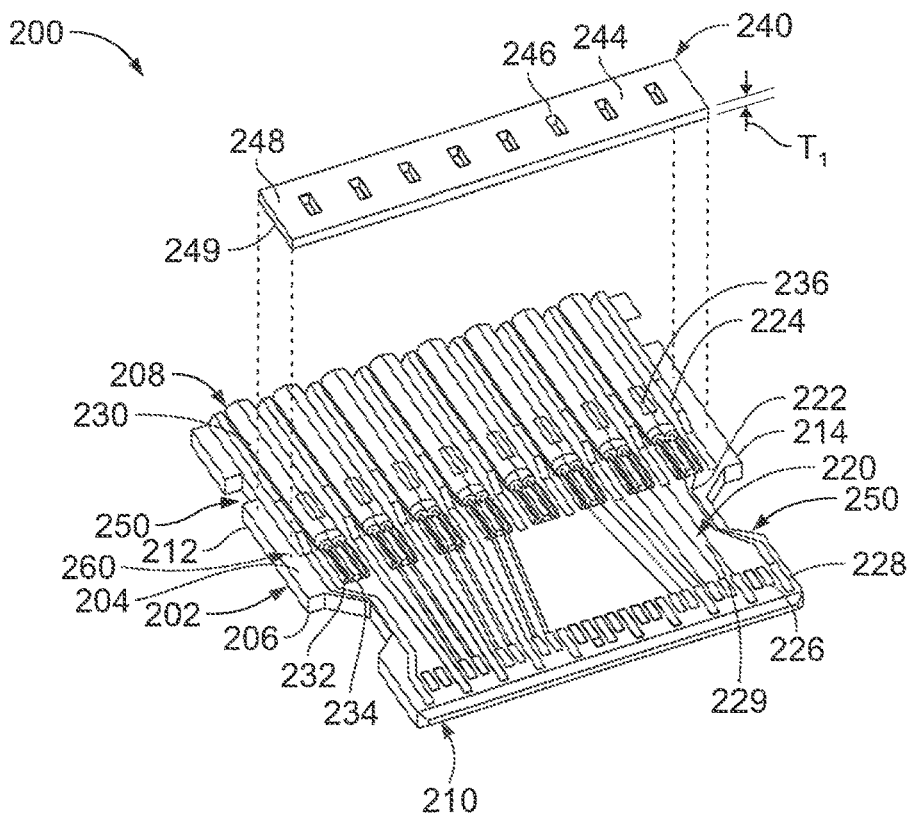
FIG. 2 is a partially exploded perspective view of a cable assembly according to an embodiment that may be used with the electrical device of FIG. 1.

FIG. 2 is a partially exploded perspective view of a cable assembly 200 according to one embodiment that may be used with the electrical device of FIG. 1. The cable assembly 200 may be used as the connector assembly 102 (FIG. 1) and may be disposed at least partially within the device housing 120 (FIG. 1). The cable assembly 200 includes a molded interconnect substrate 202 having top and bottom board surfaces 204, 206 that face in opposite directions, a terminating edge 208, a mating edge 210, and side edges 212, 214 that extend from the terminating edge 208 toward the mating edge 210.

The molded interconnect substrate 202 includes a conductive circuit 220 along the top surface 204 having electrical contacts that are configured for electrically and mechanically connecting to one or more communication cables 230. For example, the conductive circuit may include signal contacts 222 and ground contacts 224 proximate the terminating edge 208, and signal contacts 226 and ground contacts 228 proximate the mating edge 210, which may be communicatively coupled to one another through the molded interconnect substrate 202. For example, the molded interconnect substrate 202 may include circuit traces 229 that communicatively couple the electrical contacts 222, 224, 226, 228 to each other. Eight communication cables 230 are shown terminated to the conductive circuit 220, however, the cable assembly 200 may include any number of communication cables 230. Optionally, the molded interconnect substrate 202 may also include a conductive circuit (not shown) along the bottom surface 206 that is configured for electrically and mechanically connecting to one or more communication cables 230. The conductive circuit on the bottom surface 206 may mirror the configuration of the conductive circuit 220, or alternatively, the conductive circuit on the bottom surface 206 may have a different configuration.

In some embodiments, the communication cables 230 may be characterized as twin-axial or parallel-pair cables that include two signal conductors 232, 234 and a grounding element 236, such as a shield layer and/or a drain wire. In parallel-pair configurations, the communication cables 230 include differential pairs of signal conductors 232, 234 in which the two signal conductors 232, 234 extend parallel to each other through a length of the communication cable 230. The grounding element 236 also extends parallel with the signal conductors 232, 234 through the length of the communication cable 230. Although not shown, the communication cables 230 of FIG. 2 may be part of a larger cable and may be surrounded by an external jacket or sleeve. The external jacket may be stripped to permit manipulation of the communication cables 230 as set forth herein. In alternative embodiments, the signal conductors 232, 234 within the communication cable 230 may form a twisted pair of signal conductors. In other various embodiments, the communication cable 230 may be a single-ended cable having a single central conductor rather than the pair of signal conductors.

The cable assembly 200 includes an ground-terminating component 240 configured to electrically couple to the molded interconnect substrate 202 and the communication cables 230, as set forth below in more detail. Each ground-terminating component 240 may be a single continuous piece of material. For example, the ground-terminating component 240 may be stamped and formed from sheet metal or may be molded or cast using a conductive material. Although one ground-terminating component 240 is shown in FIG. 2, alternate embodiments of the cable assembly 200 may include any number of ground-terminating components 240. Optionally, the cable assembly 200 may include a ground-terminating component configured to electrically couple the bottom surface 204 of the substrate and one or more communication cables 230.

As shown in FIG. 2, the molded interconnect substrate 202 includes positioning elements 250 configured for engagement during manufacturing and/or assembly. For example, the positioning elements 250 may include generally rectangular detents positioned along the side edges 212, 214 proximate to the terminating end 208. Optionally, the positioning elements 250 may include may be generally semi-circular shaped detents positioned along the side edges 212, 214 proximate the mating end 210. The positioning elements or detents 250 may be engaged by tools and/or tooling for handling of the molded interconnect substrate 202 and positioning of additional components on the molded interconnect substrate 202 during manual or automated assembly of the cable assembly 200.

Figure 3:
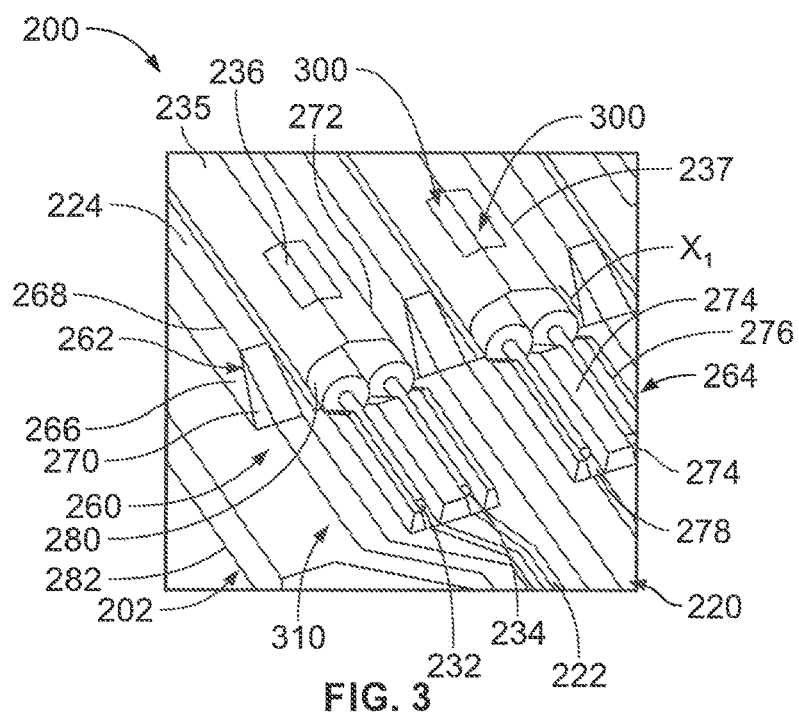
FIG. 3 is an is an enlarged portion of the partially exploded perspective view of FIG. 2 illustrating features of the cable assembly in greater detail.

FIG. 3 is an is an enlarged portion of the partially exploded perspective view of FIG. 2 illustrating features of the cable assembly 200 in greater detail. The molded interconnect substrate 202 includes alignment elements 260 that are positioned along the top surface 204 for alignment of the communication cables 230 with the conductive circuit 220. For example, the alignment elements 260 may include ground alignment elements 262 and signal alignment elements 264 that are configured to align the grounding element 236 and the signal conductors 232, 234 of the communication cables 230 with corresponding ground contacts 224 and signal contacts 222 of the conductive circuit 220.

As shown in FIG. 3, each ground alignment element 262 is a raised longitudinal rib proximate the terminating edge 208 of the molded interconnect substrate 202 having sidewalls 266 and an upper wall 268 extending therebetween. Optionally, each ground alignment element 262 includes a ramp 270 that extends from a first level co-planar with the top surface 204 of the molded interconnect substrate 202 to a second level coplanar with the upper wall 268. The ground contacts 224 are positioned along corresponding ramps 270 and upper walls 268 and adjacent the grounding elements 236 of the communication cables 230. The ground alignment elements 262 define channels 272 therebetween configured to receive one of the corresponding communication cables 230.

Each signal alignment element 264 is a raised longitudinal rib having sidewalls 274 and an upper wall 276 extending therebetween. The signal alignment elements 264 define channels 278 therebetween configured to receive one of the corresponding signal conductors 232, 234. The signal contacts 222 are positioned in the channels 278 for connection with the signal conductors 232, 234. The molded interconnect substrate 202 includes one or more sets of three signal alignment elements 264 with two channels 278 therebetween configured to receive the signal conductors 232, 234 of a corresponding communication cable 230.

The molded interconnect substrate 202 can be formed using molded interconnect technology. For example, the molded interconnect substrate 202 may be formed using injection-molding from materials suitable for laser direct structuring technology. The molded interconnect substrate 202 can be formed from a molding component doped or impregnated with a laser direct structuring component. The molding component may include polymer or thermoplastic materials, including, but not limited to, acrylonitrile butadiene styrene (ABS) polycarbonate (PC), polyphthalamide (PA/PPA), polybutylene terephthalate (PBT), cyclo-olefin polymer (COP), polyphenylene (PPE), and the like. The laser direct structuring component may include an organic metal compound, including not limited to, copper, nickel, gold, and the like, which can be activated by a physicochemical reaction induced by laser. The laser direct structuring component may be activated with laser ablation to form the conductive circuit 220, including the signal contacts 222, 226, ground contacts, 224, 228, and circuit traces 229 along the top and/or bottom surfaces 204, 206 of the molded interconnect substrate 202. For example, the molding component may include particles of the laser direct structuring component throughout the molding component. A focused laser beam directed at the substrate 202 cracks open the complex compounds in the doped molded component, and breaks off the metal atoms from the organic ligands. These may act as nuclei for reductive metal coating. In addition to activation, the laser also creates a microscopically irregular surface on the substrate 202. The laser only ablates the molding component, not the laser structuring component. This creates microscopic pits and undercuts in which the laser structuring component is firmly anchored during metallization.

Optionally, the circuit traces 229 may be treated and/or plated with various surface treatments for solderability and use. In alternate embodiments, the molded interconnect substrate 202 may be formed using other molded interconnect processes, such as a masking method, two-component injection molding with subsequent electroplating, or hot embossing.

By using molded interconnect technology, the molded interconnect substrate 202 may be manufactured with more precise manufacturing tolerances as compared to conventional manufacturing of a printed circuit boards (PCB). For example, injection molding of the molded interconnect substrate 202 may have a manufacturing tolerance of about +/−0.05 mm. Comparatively, manufacture tolerance of printed circuit boards is about +/−0.1 mm. In addition, molded interconnect technology provides for manufacturing of the molded interconnect substrate 202 with non-planar or three-dimensional elements. For example, the molded interconnect substrate 202 can be manufactured as a unitary component with the alignment elements 260 on the top surface 204 of the molded interconnect substrate 202. In addition, laser direct structuring technology provides for the formation or establishment of circuit traces 229 on any of the levels and/or surfaces of the molded interconnect substrate 202. For example, the signal contacts 222, 226 may be formed at a first level being coplanar with the top surface 204, and the ground contacts 224 may be formed at a second level on the upper wall 268 of the ground alignment elements 262 adjacent the grounding elements 236. In alternate embodiments, the molded interconnect substrate 202 may also be configured in a multiple layer arrangement by molding, LDS, and connecting the substrate layers through various techniques, including, but not limited to, ultrasonic welding, epoxy, heat sinking, and the like.

As shown in FIG. 3, each of the communication cables 230 may include the differential pair of signal conductors 232, 234, the grounding element 236, such as a shield layer, that surrounds the signal conductors 232, 234, and a cable jacket 235 that surrounds the grounding element 236. By way of example only, the cable jacket 235 may be formed from a polyester-like material, such as biaxially-oriented polyethylene terephthalate (BoPET). The grounding element 236 may include, for example, a copper conductive foil. As shown, the grounding element 236 is exposed through an access opening 300 of the cable jacket 235. The access opening 300 may be spaced from an end of the cable jacket 235. For example, the cable jacket 235 includes a jacket edge 237. The access opening 300 may be located a longitudinal distance $X_1$ away from the jacket edge 237 along a length of the communication cable 230. The access opening 300 extends a depth into the communication cable 230 from an exterior surface of the cable jacket 235 to the grounding element 236. The access opening 300 may be formed by, for example, using a laser, to etch the cable jacket 235 to remove the material of the cable jacket 235 and expose the grounding element 236. Accordingly, the access opening 300 may be a void along the grounding element 236. The access opening 300 may be partially defined by the material of the cable jacket 235 and the grounding element 236. The access opening 300 may open to an exterior of the communication cable 230.

In an exemplary embodiment, each communication cable 230 includes insulated conductors having insulation layers 280, 282, respectively, that surround corresponding signal conductors 232, 234. As shown, the signal conductors 232, 234 have had the insulation layers 280, 282 stripped therefrom to expose the signal conductors 232, 234. The exposed portions of the signal conductors 232, 234 are configured to be terminated to the molded interconnect substrate 202. As such, the exposed portions of the signal conductors 232, 234 are hereinafter referred to as a wire-terminating ends 232, 234.

Each communication cable 230 is configured to electrically couple to the molded interconnect substrate 202 at multiple points. To this end, the molded interconnect substrate 202 includes a contact set 310 that has three electrical contacts. More specifically, the contact set 310 includes a pair of signal contacts 222 and a ground contact 224 that is located proximate to the pair of signal contacts 222. The molded interconnect substrate 202 may have multiple contact sets 310 in which each contact set 310 electrically couples to a single communication cable 230. The signal contacts 222 are configured to be electrically coupled to the wire-terminating ends 232, 234, respectively. For example, the wire-terminating ends 232, 234 may be soldered to the signal contacts 222, respectively. Optionally, the mechanical and electrical coupling may also be accomplished through a conductive epoxy or foam, and the like.

Referring back to FIG. 2, the ground-terminating component 240 includes a main panel or busbar portion 244. The main panel 244 is configured to be mechanically and electrically coupled to corresponding ground contacts 224 of the molded interconnect substrate 202. In some embodiments, the ground-terminating component 240 is stamped from sheet metal and formed to include the features set forth herein. The ground-terminating component 240 includes a top surface 248 and a bottom surface 249 that face in opposite directions. The thickness $T_1$ is measured between the top and bottom surfaces 248, 249. In the illustrated embodiment, the thickness $T_1$ is substantially uniform, but may have varying sizes in other embodiments. As shown on FIG. 2, the main panel 244 may be positioned adjacent to the communication cables 230 such that the bottom surface 249 along the main panel 244 interfaces with the cable jackets 235 and/or covers the access opening 300.

The main panel 244 includes a plurality of the connective terminals 246 that are aligned with corresponding access openings 300 of the cable jackets 235. As shown in FIG. 2, the connective terminals 246 are generally circular openings, however and configuration of opening can be used, including but not limited to rectangular, slots, and the like. The connective terminals 246 of the main panel 244 may be located to align with corresponding access openings 300 of the cable jackets 235 when the main panel 244 interfaces with the communication cable 230. Solder paste (not shown) may be deposited into and/or near the access openings 300 and the connective terminals 246. Heat may be applied to the cable assembly 200 to melt and/or cure the solder paste. After the heating stage, the solder mechanically and electrically couples the main panel 244 to the grounding element 236 of the different communication cables 230.

In other embodiments, a different conductive binding material may be used. For example, the conductive binding material may be an adhesive, epoxy, foam, tape, or the like. The conductive binding material may or may not affix the main panel 244 to the grounding elements 236. In some embodiments, a conductive tape or other binding material may be deposited directly along the bottom surface 238. The bottom surface 238 may then be pressed against the grounding elements 236. The action of compressing the binding material may activate the binding material to harden or cure. For such embodiments, a wall opening may or may not be used.

In other embodiments, the connective terminals 246 may have other configurations to mechanically and electrically couple the ground-terminating component 240 with the grounding element 236, including, but not limited to, a single tab, or an insulation displacement connector. For example, each connective terminal 246 may include a substantially rectangular opening with a pair of opposed tabs extending inwardly towards each other (not shown) to form a channel between the tabs configured to receive the grounding element 236 of a communication cable 230 and to provide an opening for application of solder or other conductive binding material. In addition, the connective terminal 246 can be configured to couple with the grounding element 236 with an interference or pinch fit.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. An electrical device comprising:
   a molded interconnect substrate having a top surface and a bottom surface, the substrate having a three-dimensional molding component molded on the top surface and a laser direct structuring component embedded with the molding component;
   a conductive circuit formed from the laser direct structuring component along the molding component of the top surface, the conductive circuit having one or more signal contacts and one or more ground contacts; and
   a communication cable including a differential pair of signal conductors and a grounding element providing electrical shielding for the signal conductors; wherein the communication cable has a cable jacket surrounding the signal conductors and the grounding element; wherein each signal conductor has a wire-terminating end that is coupled to a corresponding signal contact, the wire-terminating end projecting beyond a jacket edge of the cable jacket, wherein the grounding element is coupled to a corresponding ground contact.

2. The electrical device of claim 1, wherein the one or more signal contacts are positioned at a first level being coplanar with the top surface, and the one or more ground contacts are positioned at a second level adjacent the grounding element.

3. The electrical device of claim 1, further comprising one or more alignment elements positioned along the top surface of the molded interconnect substrate and configured to align the signal conductors and grounding element of the communication cable with corresponding signal contacts and corresponding ground contacts of the conductive circuit.

4. The electrical device of claim 1, further comprising a ground-terminating component electrically coupled to the one or more ground contacts, the ground-terminating component having a main panel with a connective terminal electrically coupled to the grounding element.

5. The electrical device of claim 1, wherein the molded interconnect substrate has a manufacturing tolerance of about +/−0.05 or less.

6. The electrical device of claim 1, wherein the molded interconnect substrate includes positioning elements configured for engagement during automated assembly.

7. The electrical device of claim 1, wherein the molded interconnect substrate is nonplanar having three dimensional features.

8. The electrical device of claim 1, wherein the conductive circuit is established via laser structuring technology.

9. The electrical device of claim 1, further comprising a second conductive circuit formed along the bottom surface, the second conductive circuit having one or more signal contacts and one or more ground contacts;
  a second communication cable including a differential pair of signal conductors and a grounding element; wherein the second communication cable has a cable jacket surrounding the signal conductors and the grounding element; wherein each signal conductor has a wire-terminating end that is coupled to a corresponding signal contact of the second conductive circuit, the wire-terminating end projecting beyond a jacket edge of the cable jacket, wherein the grounding element of the second communication cable is coupled to a corresponding ground contact of the second conductive circuit; and
  a second ground-terminating component electrically coupled to the one or more ground contacts of the second conductive circuit, the second ground-terminating component having a main panel with a connective terminal electrically coupled to the grounding element of the second communication cable.

10. An electrical device comprising:
  a molded interconnect substrate having a top surface, the molded interconnect substrate formed from a three-dimensional molding component molded on the top surface and a laser direct structuring component embedded with the molding component;
  a conductive circuit formed from the laser direct structuring component along the molding component of the top surface, the conductive circuit having one or more signal contacts and one or more ground contacts configured to electrically couple with one or more communication cables; and
  an alignment element positioned along the top surface of the molded interconnect substrate and configured for alignment of one or more communication cables with the corresponding one or more signal contacts and one or more ground contacts of the conductive circuit.

11. The electrical device of claim 10, wherein the signal contacts are positioned at a first level being coplanar with the top surface, and the ground contacts are positioned at a second level being non-coplanar with the first level.

12. The electrical device of claim 10, further comprising a ground-terminating component configured to electrically couple to the at least one ground contact, the ground-terminating component having a main panel with a connective terminal configured to electrically couple to the one or more communication cables.

13. The electrical device of claim 10, wherein the molded interconnect substrate has with a manufacturing tolerance of about +/−0.05 or less.

14. The electrical device of claim 10, wherein the molded interconnect substrate includes positioning elements configured for engagement during automated assembly.

15. The electrical device of claim 10, wherein the molded interconnect substrate is nonplanar having three dimensional features.

16. The electrical device of claim 10, wherein the conductive circuit is established via laser structuring technology.

17. The electrical device of claim 10, further comprising a second conductive circuit formed along a bottom surface of the molded interconnect substrate, the second conductive circuit having one or more signal contacts and one or more ground contacts configured to electrically and mechanically couple with one or more communication cables;
  a second alignment element positioned along the bottom surface of the molded interconnect substrate and configured for alignment of one or more communication cables with the corresponding one or more signal contacts and one or more ground contacts of the second conductive circuit.

18. A cable assembly, comprising:
  a molded interconnect substrate having a top surface, the substrate having a three-dimensional molding component molded on the top surface and a laser direct structuring component embedded with the molding component;
  a conductive circuit established from the laser direct structuring component along the molding component of the top surface via laser direct structuring technology, the conductive circuit having one or more signal contacts and one or more ground contacts;
  a communication cable including a differential pair of signal conductors and a grounding element; wherein the communication cable has a cable jacket surrounding the signal conductors and the grounding element; wherein each signal conductor has a wire-terminating end that is coupled to a corresponding signal contact, the wire-terminating end projecting beyond a jacket edge of the cable jacket, wherein the grounding element is coupled to a corresponding ground contact; and
  an alignment element formed from the three dimensional molding component positioned along the top surface of the molded interconnect substrate and configured to align the signal conductors and grounding element of the communication cable with corresponding one or more signal contacts and ground contacts of the conductive circuit.

19. The cable assembly of claim 18, wherein the one or more signal contacts are positioned at a first level being coplanar with the top surface, and the one or more ground contacts are positioned at a second level adjacent the grounding element.

20. The cable assembly of claim 18, further comprising a ground-terminating component electrically coupled to the one or more ground contacts, the ground-terminating component having a main panel with a connective terminal electrically coupled to the grounding element.

21. A method of forming an electrical device comprising:
  molding a molded interconnect substrate having a top surface and a bottom surface to include a molding component and a laser direct structuring component embedded with the molding component;

activating the laser direct structuring component with a laser to form a conductive circuit along the molding component at the top surface, the conductive circuit having one or more signal contacts and one or more ground contacts; and coupling a communication cable to the molded interconnect substrate, wherein the communication cable includes a differential pair of signal conductors and a grounding element providing electrical shielding for the signal conductors;

wherein the communication cable has a cable jacket surrounding the signal conductors and the grounding element; wherein each signal conductor has a wire-terminating end that is coupled to a corresponding signal contact, the wire-terminating end projecting beyond a jacket edge of the cable jacket, wherein the grounding element is coupled to a corresponding ground contact.

* * * * *